(12) United States Patent
Kim

(10) Patent No.: US 11,085,110 B2
(45) Date of Patent: Aug. 10, 2021

(54) MASK AND METHOD OF MANUFACTURING THE SAME

(71) Applicant: LG Display Co., Ltd., Seoul (KR)

(72) Inventor: Hyunjun Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 20 days.

(21) Appl. No.: 16/716,051

(22) Filed: Dec. 16, 2019

(65) Prior Publication Data

US 2020/0208250 A1 Jul. 2, 2020

(30) Foreign Application Priority Data

Dec. 28, 2018 (KR) .................. 10-2018-0171804

(51) Int. Cl.
*C23C 14/04* (2006.01)
*C23C 14/14* (2006.01)
*C23C 14/08* (2006.01)
*C23C 14/58* (2006.01)
*C23C 14/34* (2006.01)
*C23C 8/10* (2006.01)
*H01L 51/00* (2006.01)

(52) U.S. Cl.
CPC .............. *C23C 14/042* (2013.01); *C23C 8/10* (2013.01); *C23C 14/086* (2013.01); *C23C 14/14* (2013.01); *C23C 14/34* (2013.01); *C23C 14/5846* (2013.01); *C23C 14/5873* (2013.01); *H01L 51/0011* (2013.01)

(58) Field of Classification Search
None
See application file for complete search history.

(56) References Cited

U.S. PATENT DOCUMENTS

2006/0243700 A1* 11/2006 Rippstein ............. H05K 3/1225
216/12

FOREIGN PATENT DOCUMENTS

KR 20000071524 B1 11/2000

* cited by examiner

*Primary Examiner* — Michael P Wieczorek
*Assistant Examiner* — Michael G Miller
(74) *Attorney, Agent, or Firm* — Seed IP Law Group LLP

(57) ABSTRACT

Provided is a method of manufacturing a mask includes preparing a first conductive layer. The first conductive layer includes a third portion having a mesh shape in a plurality of cell regions on a substrate, a second portion disposed between the cell regions, and a first portion surrounding the third portion and the second portion. The method further includes preparing a second conductive layer including at least one opening on the first conductive layer. The method also includes oxidizing a part of the first conductive layer exposed through the at least one opening of the second conductive layer. The method further includes preparing a plating layer on the first conductive layer and the second conductive layer, and removing the first conductive layer and the second conductive layer from the plating layer.

12 Claims, 18 Drawing Sheets

MASK AND METHOD OF MANUFACTURING THE SAME

CROSS-REFERENCE TO RELATED APPLICATIONS

This application claims the priority of Korean Patent Application No. 10-2018-0171804 filed on Dec. 28, 2018, in the Korean Intellectual Property Office, the disclosure of which is incorporated herein by reference.

BACKGROUND

Technical Field

The present disclosure relates to a mask and a method of manufacturing the same, and more particularly, to a mask for use in a manufacturing process of an organic light emitting display device to deposit an organic layer and formed by a plating process and a method of manufacturing the same.

Description of the Related Art

As the information age advances, the field of a display device for visually displaying electrical information signals has grown rapidly. In accordance with the rapid development, various display devices having excellent performance such as thin thickness, light weight, and low power consumption properties have been developed. Specific examples of the above-mentioned display device may include a liquid crystal display device (LCD), a Quantum Dot device (QD), a field emission display device (FED), an organic light emitting display device (OLED), and the like.

Particularly, the OLED is a self-luminous device and has advantages of high response speed, luminous efficiency and luminance, and a wide viewing angle. Therefore, the OLED has been attracting a lot of attention.

The OLED includes an anode, a cathode, and an organic layer which is disposed between the anode and the cathode and in which electrons and holes combine to emit light. In general, the organic layer includes a hole injection layer (HIL), a hole transport layer (HTL), an emission layer (EML), an electron transport layer (ETL), and an electron injection layer (EIL).

The organic layer of the OLED may have a patterned emission layer structure according to a design. In the OLED having the patterned emission layer structure, emission layers emitting light of different colors are separated for respective pixels. For example, a red organic emission layer for emitting red light, a green organic emission layer for emitting green light, and a blue organic emission layer for emitting blue light may be separated in a red sub-pixel, a green sub-pixel, and a blue sub-pixel, respectively. The organic layers including the organic emission layers may be deposited and patterned on emission regions of the respective sub-pixels using a mask, e.g., a fine metal mask (hereinafter, referred to as FMM), having openings for the respective sub-pixels.

Such a mask has been typically manufactured by forming a pattern through exposure and development and then transferring the pattern on a metal sheet through wet-etching. However, when the mask is manufactured using the wet-etching process, it is difficult to precisely control the pattern width during the etching process due to the isotropy of etching. Therefore, it is difficult to obtain a high-resolution pattern.

BRIEF SUMMARY

An object to be achieved by the present disclosure is to provide a mask and a method of manufacturing the mask. In the mask, a partial region of a plating layer has a high surface roughness to easily peel off the mask from a substrate and thus minimize damage to the mask during a process.

Another object to be achieved by the present disclosure is to provide a mask and a method of manufacturing the mask. An align key region formed on a surface of the mask has a reduced reflectance, and, thus, a detection rate for an align key can be improved and the mask can be easily disposed at a desired position.

Yet another object to be achieved by the present disclosure is to provide a method of manufacturing a mask using two or more conductive layers with different resistances. In the mask, a plating layer to be formed by electroplating can be easily peeled off and has high uniformity in thickness.

Objects of the present disclosure are not limited to the above-mentioned objects, and other objects, which are not mentioned above, can be clearly understood by those skilled in the art from the following descriptions.

According to an aspect of the present disclosure, a method of manufacturing a mask includes forming a first conductive layer on a substrate. The first conductive layer includes a third portion having a mesh shape in a plurality of cell regions on the substrate, a second portion disposed between the cell regions on the substrate, and a first portion surrounding the third portion and the second portion on the substrate.

The method further includes forming a second conductive layer on the first conductive layer, the second conductive layer having at least one opening therethrough that exposes at least one part of the first conductive layer. The method also includes oxidizing the exposed part of the first conductive layer through the at least one opening of the second conductive layer. The method further includes forming a plating layer on the first conductive layer and the second conductive layer, and removing (peeling off) the first conductive layer and the second conductive layer from the plating layer resulting in the mask that is comprised of the plating layer.

According to another aspect of the present disclosure, a mask includes a first portion surrounding an outer periphery of a plurality of cell regions. The mask further includes a second portion located between the cell regions and a third portion defining a plurality of openings in the plurality of cell regions. The first portion includes an align key region with a higher surface roughness than a peripheral region adjacent to the align key region within the first portion.

According to another aspect of the present disclosure, a mask includes a plurality of first regions. A plurality of holes are located on each of the plurality of first regions, at least one of the holes having a first end opening and a second end opening that is smaller than the first end opening. The mask also includes a second region located between the first regions. The mask further includes a third region surrounding the first regions and the second region. A reflectance value on a first surface located on the second region or the third region is lower than a reflectance value on a second surface located on the second region or the third region.

Other detailed matters of the exemplary embodiments are included in the detailed description and the drawings.

According to the present disclosure, a mask includes a partial region with a higher surface roughness than its peripheral region. Thus, it is possible to easily peel off the mask from a substrate and minimize damage to the mask during the manufacturing process.

According to the present disclosure, an align key with a high surface roughness is formed. Thus, by reducing the reflection using the high surface roughness, it is possible to increase a detection rate of the align key and easily align the mask.

According to the present disclosure, a first conductive layer and a second conductive layer having different properties are used as seed layers. Thus, it is possible to easily peel off the mask during the manufacturing process and form a mask with a uniform thickness.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
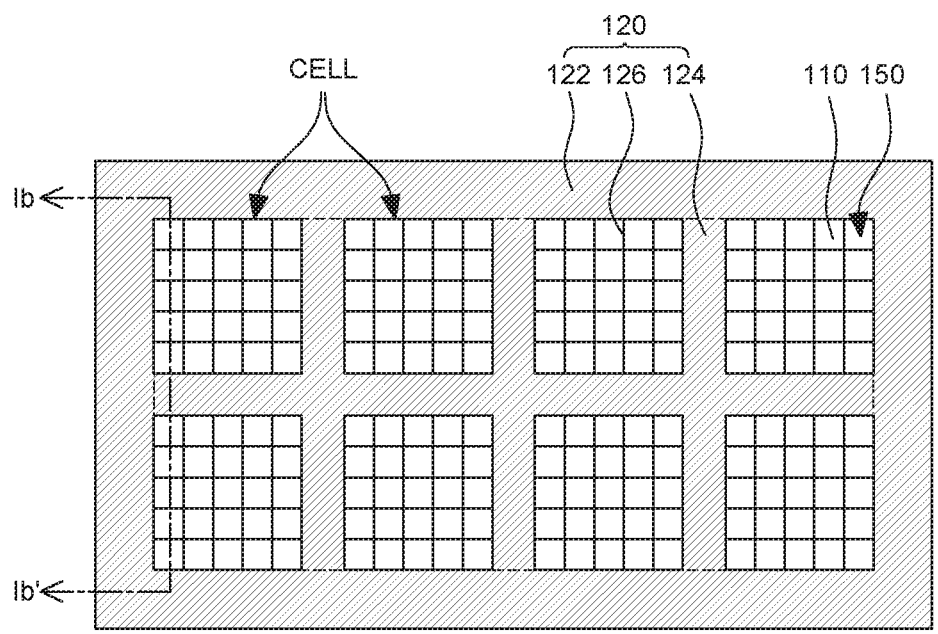
FIG. 1A through FIG. 1J are schematic plan views and cross-sectional views provided to explain a method of manufacturing a mask according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Method of Manufacturing a Mask

A method of manufacturing a mask according to an embodiment of the present disclosure includes preparing a first conductive layer. The first conductive layer includes a third portion having a mesh shape in a plurality of cell regions on a substrate, a second portion disposed between the cell regions, and a first portion surrounding the third portion and the second portion. The method further includes preparing a second conductive layer including at least one opening (hereinafter, also referred to as open region) on the first conductive layer. The method also includes oxidizing a part of the first conductive layer exposed through the at least one open region of the second conductive layer. The method further includes preparing a plating layer by plating using the first conductive layer and the second conductive layer as seed layers, and removing (peeling off) the first conductive layer and the second conductive layer from the plating layer. Hereafter, the method of manufacturing a mask will be described in more detail with reference to FIG. 1A through FIG. 1J.

Accordingly, the inventors of the present disclosure developed a process for manufacturing a mask, e.g., FMM, for use in a manufacturing process of the OLED by electroplating. In the electroplating process, a plating layer is formed on a seed pattern disposed on a substrate by applying a current to the seed pattern.

A mask manufactured by electroplating might have a small thickness and a low surface roughness. In some instances, it is not easily peeled off from the substrate due to static electricity between the mask and the substrate. Further, when the mask is peeled off from the substrate, the mask may be damaged.

Another shortcoming is that a mask manufactured by electroplating has a very low surface roughness. Thus, during a process of detecting an align key for alignment, a detection rate for the align key is greatly decreased due to a high surface reflectance which is caused by the very low surface roughness of the mask. Therefore, it is difficult to align the mask at a desired position.

Accordingly, the inventors of the present disclosure recognized the above-described problems of electroplating and invented a mask which can be easily peeled off from a substrate and provide a way for providing a high surface roughness at selected locations to aid in alignment. They also teach herein a method of manufacturing such a mask.

FIG. 1A through FIG. 1J are schematic plan views and cross-sectional views provided to explain the method of manufacturing a mask according to an embodiment of the present disclosure.

Figure 1B:
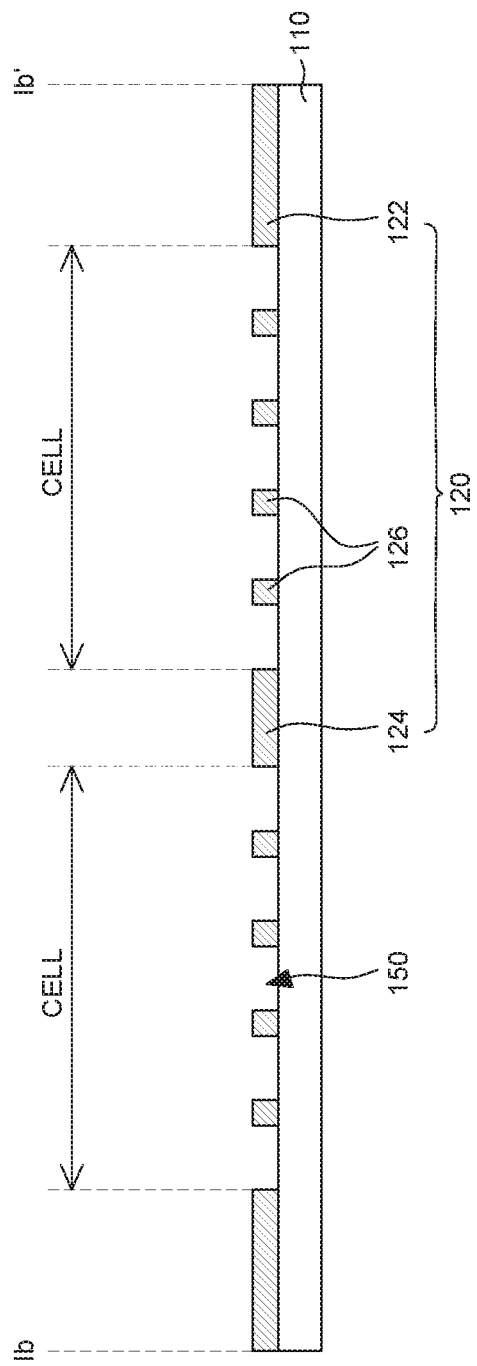

Referring to FIG. 1A and FIG. 1B, a first conductive layer 120 is formed on a substrate 110. The first conductive layer 120 includes a third portion 126 having a mesh shape in a plurality of cell regions CELL, a second portion 124 disposed between the cell regions CELL, and a first portion 122 surrounding the third portion 126 and the second portion 124.

The substrate 110 is a substrate to support components formed on the substrate 110. The substrate 110 may be formed of an insulating material to suppress the application of a current to the substrate 110. The plurality of cell regions CELL corresponding to a plurality of OLEDs is defined on the substrate 110. Each cell region CELL includes a plurality of openings corresponding to a plurality of pixels of an OLED.

The first conductive layer 120 is disposed on the substrate 110. The first conductive layer 120 functions as a seed layer in a plating process to be performed later.

The first conductive layer 120 includes the first portion 122 surrounding an outer periphery of the plurality of cell regions CELL and the second portion 124 located between the cell regions CELL. The first conductive layer 120 further includes the third portion 126 defining a plurality of openings 150 in the plurality of cell regions CELL.

The third portion 126 of the first conductive layer 120 is defined as a conductive layer having a mesh shape in the plurality of cell regions CELL. The third portion 126 of the first conductive layer 120 defines the plurality of openings 150 corresponding to a plurality of pixels of an OLED in the plurality of cell regions CELL. The third portion 126 of the first conductive layer 120 may have a mesh shape in the plurality of cell regions CELL.

The second portion 124 of the first conductive layer 120 is defined as a conductive layer located between the cell regions CELL. The second portion 124 of the first conductive layer 120 separates the plurality of cell regions CELL on the substrate 110.

The first portion 122 of the first conductive layer 120 is defined as a conductive layer disposed at the outermost periphery to surround the plurality of cell regions CELL. The first portion 122 of the first conductive layer 120 is a conductive layer located to surround the second portion 124 and the third portion 126 of the first conductive layer 120 as well as the plurality of cell regions CELL. Herein, the plurality of cell regions CELL may be defined as regions surrounded by the first portion 122 and the second portion 124 of the first conductive layer 120.

The first conductive layer 120 is a seed layer and formed of a conductive material through which a current can flow. For example, the first conductive layer 120 may be formed of a metal material such as silver (Ag), copper (Cu), chromium (Cr), titanium (Ti), molybdenum-titanium alloy (MoTi), or the like. Otherwise, the first conductive layer 120 may be formed of transparent conductive oxide (TCO) based on indium tin oxide (ITO), indium zinc oxide (IZO), indium tin zinc oxide (ITZO), zinc oxide (ZnO), and tin oxide (TiO). However, the present disclosure is not limited thereto.

The first conductive layer 120 may be formed of a conductive material having a lower resistance than the second conductive layer 130 to be described later. Since the first conductive layer 120 is formed of a material having a low resistance, it can function as a seed layer in a plating process.

The first conductive layer 120 is formed on the substrate 110. The first conductive layer 120 may be formed by any appropriate techniques like sputtering and etching, but is not limited thereto. For example, the first conductive layer 120 may be formed by using various manufacturing processes such as rolling or the like according to a design.

Figure 1C:
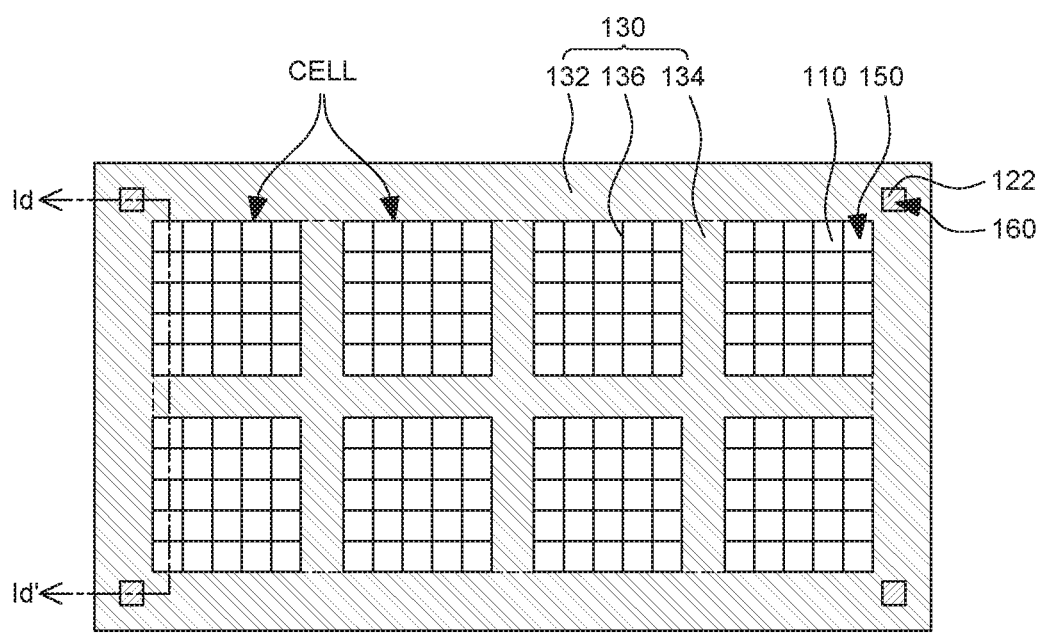
Figure 1D:
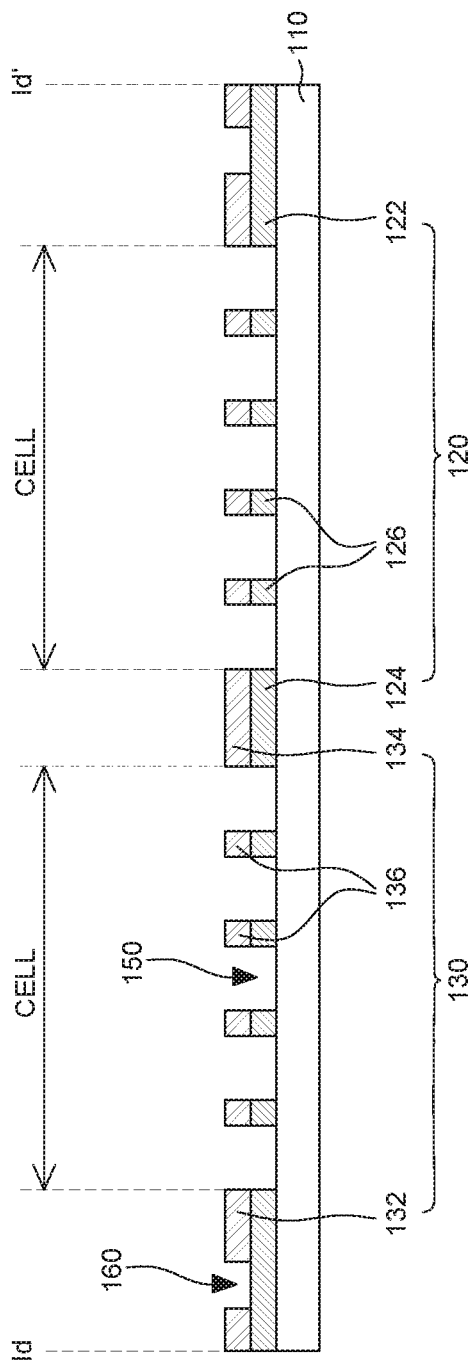

Referring to FIG. 1C and FIG. 1D, the second conductive layer 130 including at least one open region 160 is formed on the first conductive layer 120.

The second conductive layer 130 is disposed on the first conductive layer 120. The second conductive layer 130 functions as a barrier layer that suppresses the oxidation of the first conductive layer 120 in an oxidation process to be performed later. For example, the second conductive layer 130 except the open region 160 formed in part of the second conductive layer 130 can suppress the oxidation of the first conductive layer 120. Further, the second conductive layer 130 as well as the first conductive layer 120 can function as a seed layer in the plating process to be performed later.

The second conductive layer 130 includes a first portion 132, a second portion 134, and a third portion 136 corresponding to the first portion 122, the second portion 124, and the third portion 126, respectively, of the first conductive layer 120. For example, the first portion 132 of the second conductive layer 130 is disposed on the first portion 122 of the first conductive layer 120. Further, the second portion 134 of the second conductive layer 130 is disposed on the second portion 124 of the first conductive layer 120. Furthermore, the third portion 136 of the second conductive layer 130 is disposed on the third portion 126 of the first conductive layer 120.

The second conductive layer 130 includes at least one open region 160. The open region 160 exposes the first conductive layer 120 to oxidize the first conductive layer 120 in a heat treatment to be performed later.

Referring to FIG. 1C and FIG. 1D, the second conductive layer 130 includes a plurality of open regions 160. For example, the plurality of open regions 160 may be formed in the first portion 132 of the second conductive layer 130, or may be formed at four corners of the first portion 132 of the second conductive layer 130. The first conductive layer 120 is oxidized through the open regions 160 of the second conductive layer 130 in a subsequent process. The open regions 160 of the second conductive layer 130 finally correspond to an align key region on a mask.

The second conductive layer 130 may be formed of a conductive material having an excellent resistance to oxidation. For example, the second conductive layer 130 may be formed of a conductive material which is not oxidized in a high-temperature heat treatment to be performed later to oxidize the first conductive layer 120.

Further, the second conductive layer 130 may be formed of a material having a higher resistance than the first conductive layer 120. The first conductive layer 120 may be formed of a metal material such as silver (Ag), copper (Cu), chromium (Cr), titanium (Ti), molybdenum (Mo), molybdenum-titanium alloy (MoTi), or the like. In this case, the second conductive layer 130 may be formed of transparent conductive oxide (TCO) based on indium tin oxide (ITO), indium zinc oxide (IZO), indium tin zinc oxide (ITZO), zinc oxide (ZnO), and tin oxide (TiO). In this case, the second conductive layer 130 may be formed of amorphous transparent conductive oxide. The transparent conductive oxide has a higher resistance than a metal material and thus is not sufficient to function as a seed layer. However, the transparent conductive oxide has a low and smooth surface roughness. Thus, if a plating layer 140 is formed on the second conductive layer 130 through a plating process to be performed later, the plating layer 140 can be easily peeled off.

The second conductive layer 130 is formed on the first conductive layer 120. The second conductive layer 130 may be formed by any appropriate techniques like sputtering and etching, but is not limited thereto, and may be formed by using various manufacturing processes. The second conductive layer 130 may also be formed by patterning to form the open region 160.

Figure 1E:
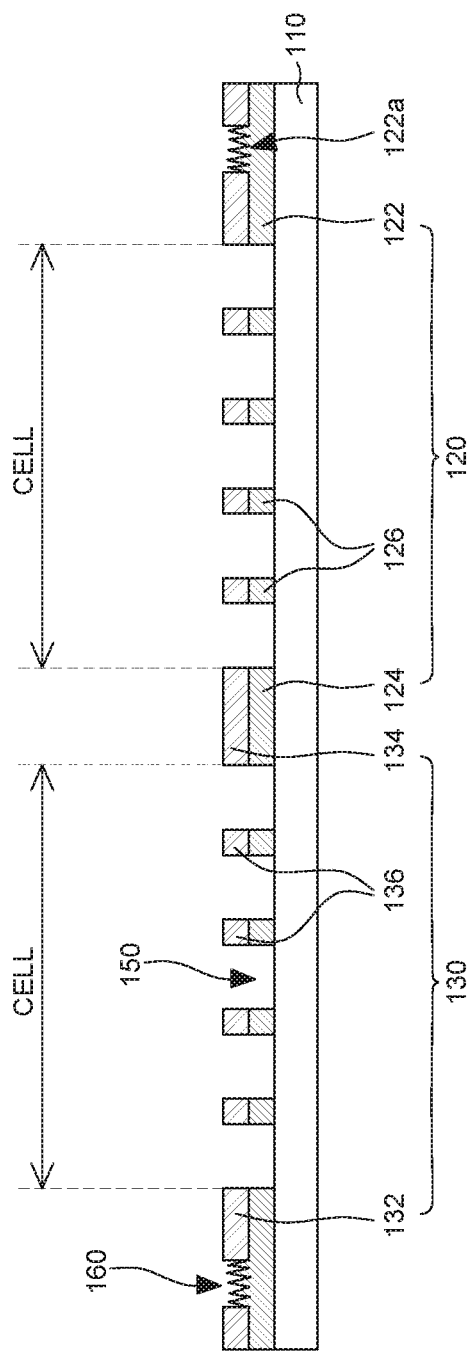

Referring to FIG. 1E, a part of the first conductive layer 120 exposed through the open region 160 of the second conductive layer 130 is oxidized.

A part of the first conductive layer 120 may be oxidized by performing the high-temperature heat treatment to the first conductive layer 120 and the second conductive layer 130. Specifically, when high-temperature heat is applied to the first conductive layer 120 and the second conductive layer 130, oxidation occurs on a surface of the first conductive layer 120 formed of a metal material. For example, a surface 122a of the first conductive layer 120 exposed to the outside through the open region 160 formed in the second conductive layer 130 is oxidized. If the first conductive layer 120 is formed of a metal material, a surface roughness of the exposed surface 122a may be greatly increased by oxidation.

Unlike the first conductive layer 120, the second conductive layer 130 is formed of a material having an excellent resistance to oxidation. Therefore, oxidation rarely occurs on the exposed surface of the second conductive layer 130. Therefore, in the high-temperature heat treatment, a surface roughness increases only in the surface 122a of the first conductive layer 120 exposed through the open region 160 of the second conductive layer 130. However, a surface roughness of the second conductive layer 130 functioning as a barrier layer does not substantially increase.

While a part of the first conductive layer 120 is oxidized, the degree of oxidation of the first conductive layer 120 can be regulated by regulating the heat treatment time and temperature. For example, a surface roughness of the first conductive layer 120 can be controlled by regulating the heat treatment time and temperature. Further, different heat treatments may be performed respectively to the plurality of open regions 160 formed in the second conductive layer 130. Thus, a surface roughness of each exposed part of the first conductive layer 120 can be controlled differently.

After oxidation, the exposed part of the first conductive layer 120 may have a surface roughness of 100 nm or more, but is not limited thereto. By comparison with a surface roughness of about 3 nm in the first conductive layer 120 which has not been oxidized through the second conductive layer 130, a surface roughness of the first conductive layer 120 exposed through the open region 160 of the second conductive layer 130 may greatly increase. After oxidation, the surface roughness of the first conductive layer 120 may be about 30 times or more than that of the second conductive layer 130.

The process of oxidizing a part of the first conductive layer 120 may include crystallizing the second conductive layer 130. For example, if the second conductive layer 130 is formed of an amorphous material, the second conductive layer 130 may be crystallized into a polycrystalline material by the heat treatment. For example, if the second conductive layer 130 is formed of amorphous-ITO (a-ITO), the second conductive layer 130 may be crystallized into poly-ITO by the heat treatment. After the heat treatment, the second conductive layer 130 crystallized into poly-ITO has a low and smooth surface roughness. Therefore, the second conductive layer 130 can be easily peeled off from the plating layer 140.

Figure 1F:
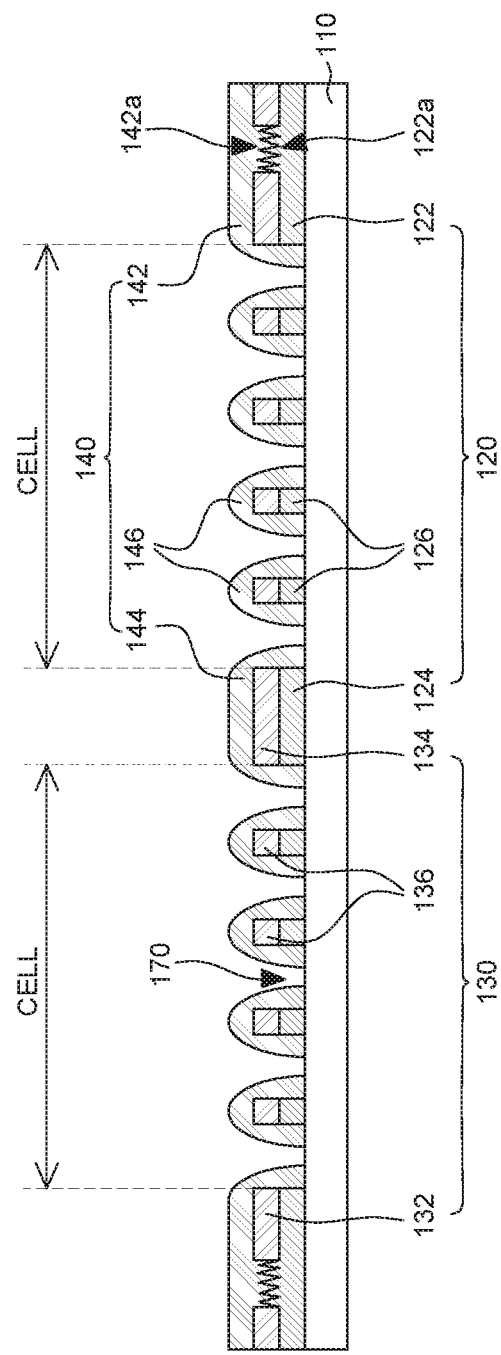

Referring to FIG. 1F, the plating layer 140 is formed by performing a plating process using the first conductive layer 120 and the second conductive layer 130 as seed layers.

The plating process for forming the plating layer 140 on the first conductive layer 120 and the second conductive layer 130 is performed. Any plating method can be employed freely according to a design as long as it can form the plating layer 140 of a metal material. In the method of manufacturing a mask according to an embodiment of the present disclosure, an electroplating method which is a wet plating process may be employed. More specifically, the electroplating method may include a vertical plating method in which plating is performed in a state where the substrate 110 including the first conductive layer 120 and the second conductive layer 130 is disposed vertically within a plating bath. The electroplating method may also include a horizontal plating method in which plating is performed in a state where the substrate 110 including the first conductive layer 120 and the second conductive layer 130 is disposed horizontally within a plating bath.

In the plating process using the electroplating method, a current is applied to the first conductive layer 120 and the second conductive layer 130 that function as seed layers. When a current flows in the first conductive layer 120 and the second conductive layer 130, the plating layer 140 is formed on the surfaces of the first conductive layer 120 and the second conductive layer 130.

The plating layer 140 is plated to surround the upper and side surfaces of the first conductive layer 120 and the second conductive layer 130. Specifically, the plating layer 140 is plated to be in contact with the side surfaces of the first conductive layer 120 and the upper and side surfaces of the second conductive layer 130.

The plating layer 140 includes a first portion 142, a second portion 144, and a third portion 146 corresponding to the first portion 122, the second portion 124, and the third portion 126 of the first conductive layer 120. For example, the first portion 142 of the plating layer 140 is disposed on the first portion 122 of the first conductive layer 120 and the first portion 132 of the second conductive layer 130, and the second portion 144 of the plating layer 140 is disposed on the second portion 124 of the first conductive layer 120 and the second portion 134 of the second conductive layer 130. Further, the third portion 146 of the plating layer 140 is disposed on the third portion 126 of the first conductive layer 120 and the third portion 136 of the second conductive layer 130. However, the plating layer 140 is plated to surround the side surfaces of the first conductive layer 120 and the second conductive layer 130. Thus, an opening 170 between the third portions 146 of the plating layer 140 has a smaller size than the opening 150 between the third portions 126 of the first conductive layer 120 and between the third portions 136 of the second conductive layer 130.

The first portion 142 of the plating layer 140 is in contact with the upper surface of the first portion 132 of the second conductive layer 130. Further, the first portion 142 of the plating layer 140 is disposed to be in contact with the upper surface 122a of the first portion 122 of the first conductive layer 120 exposed through the open region 160 of the second conductive layer 130. In the above-described oxidation process, a surface roughness of the surface 122a of the first conductive layer 120 exposed through the open region 160 of the second conductive layer 130 greatly increases. Thus, a surface 142a of the first portion 142 of the plating layer 140 in contact with the exposed surface 122a of the first conductive layer 120 may also have a high surface roughness. For example, the lower surface 142a of the first portion 142 of the plating layer 140 facing the first portion 122 of the first conductive layer 120 has a similar surface roughness to the exposed surface 122a of the first conductive layer 120.

Figure 1G:
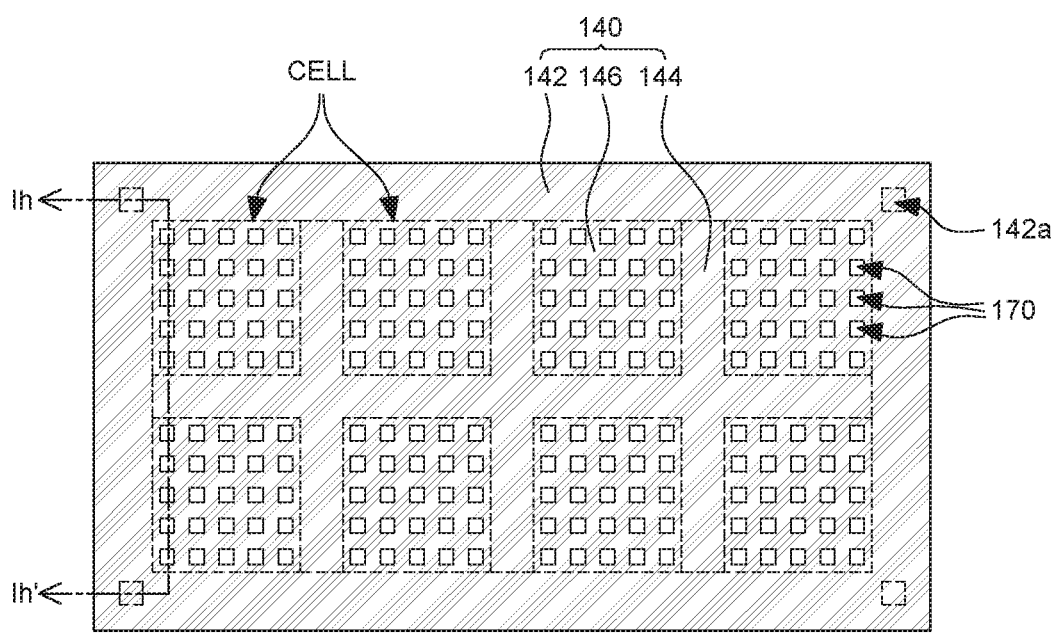
Figure 1H:
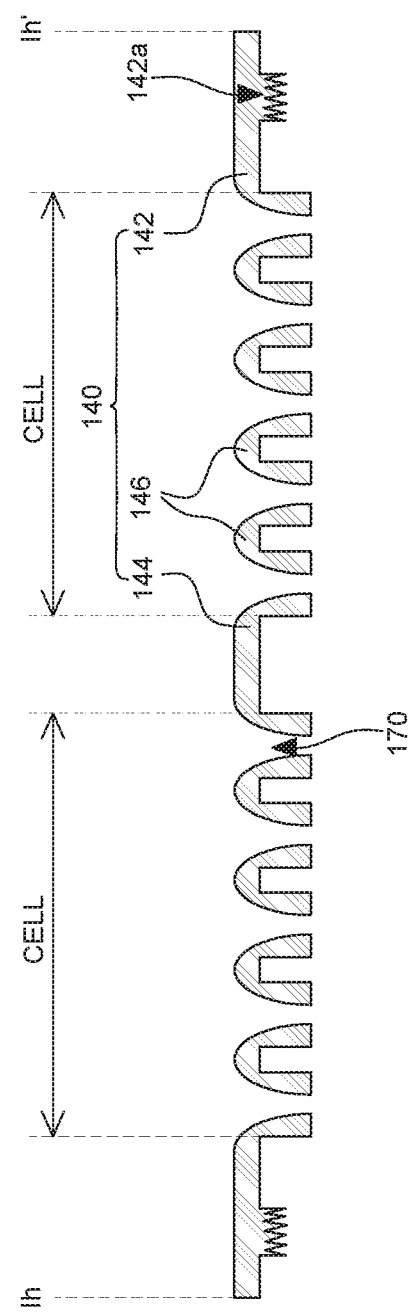

Referring to FIG. 1G and FIG. 1H, the substrate 110, the first conductive layer 120, and the second conductive layer 130 are removed (peeled off) from the plating layer 140. For example, the plating layer 140 is separated from the substrate 110, the first conductive layer 120, and the second conductive layer 130.

The substrate 110, the first conductive layer 120, and the second conductive layer 130 may be peeled off from the plating layer 140 by using any appropriate techniques like applying physical force thereto. Otherwise, the substrate 110, the first conductive layer 120, and the second conductive layer 130 may be peeled off from the plating layer 140 in a liquid to make it easy to peel off them from the plating layer 140 and wash the separated plating layer 140. Alternatively, a liquid may be sprayed between the second conductive layer 130 and the plating layer 140 to permeate the liquid between the second conductive layer 130 and the plating layer 140.

Figure 1I:
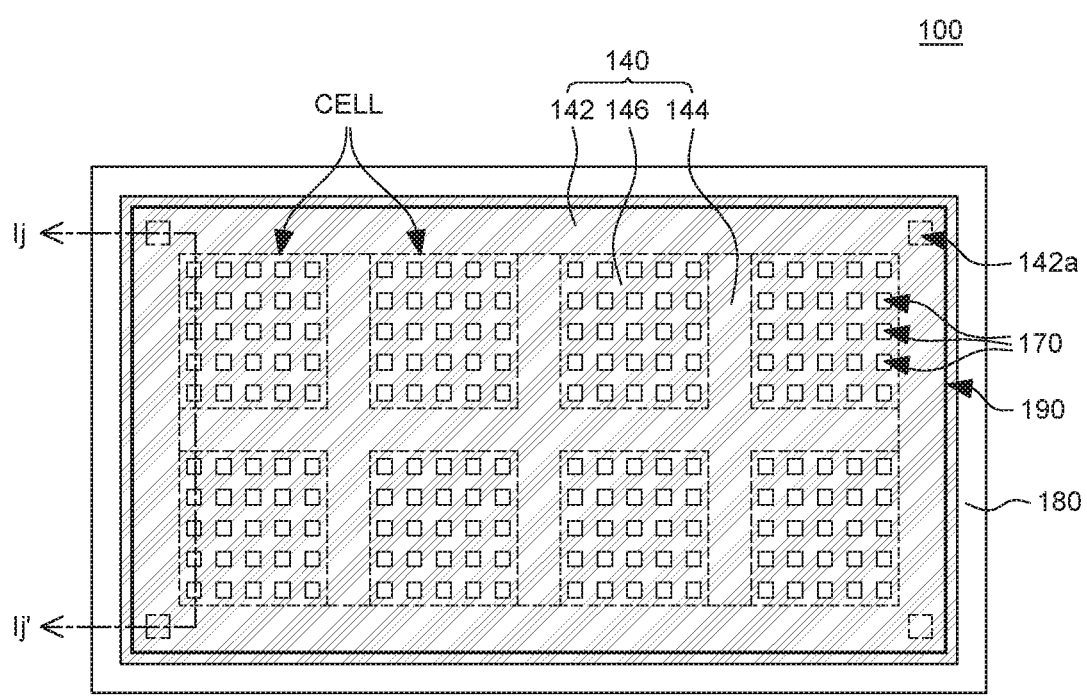
Figure 1J:
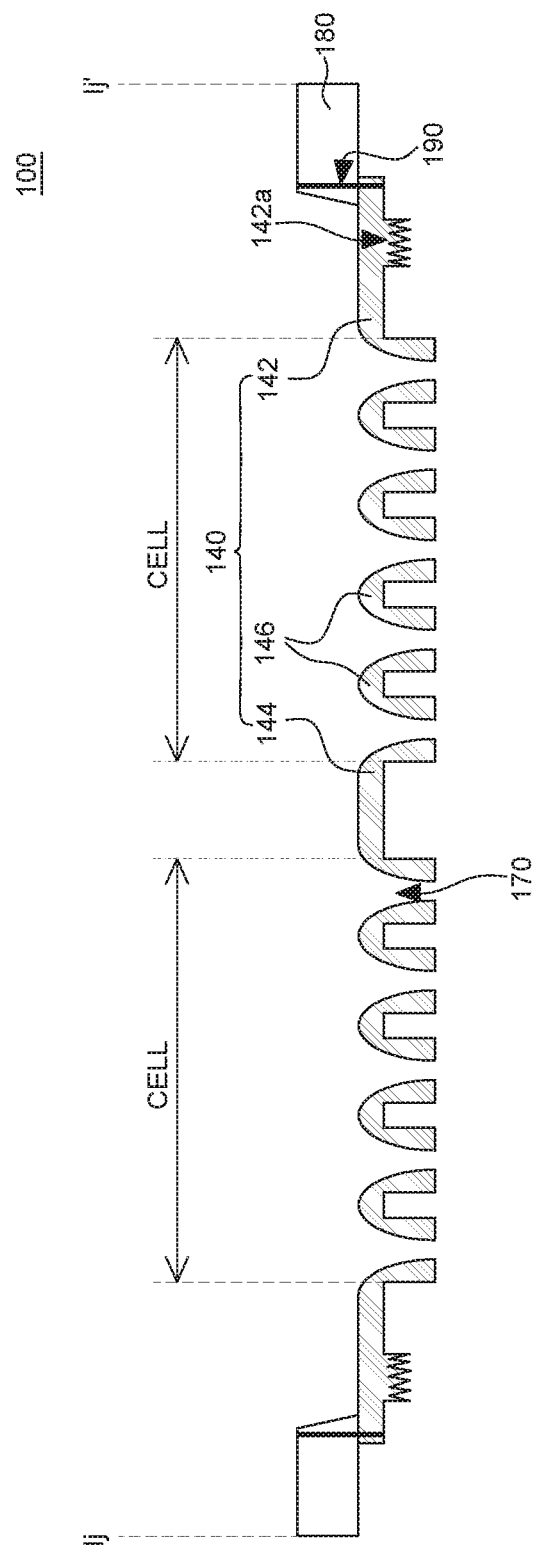

The plating layer 140, which resulted from separating the substrate 110, the first conductive layer 120, and the second conductive layer 130 from the plating layer 140 is then being welded to a frame 180. The welding step to attach the frame 180 to the plating layer 140 can be optional since the plating layer 140 can be a mask 100 alone without the fame 180. Referring to FIGS. 1I and 1J, which shows the optional step for this embodiment, the plating layer 140 welded to the frame 180 is to be used as a mask 100 according to an embodiment of the present disclosure.

The mask 100 according to an embodiment of the present disclosure includes the plating layer 140, the frame 180, and a welding portion 190. After the plating layer 140 is separated from the substrate 110, the first conductive layer 120, and the second conductive layer 130, the plating layer 140 is then welded to the frame 180.

The frame 180 may be formed to a size in which the first portion 142 of the plating layer 140 can be disposed so as to support the plating layer 140 in combination with the plating layer 140. For example, the frame 180 has a shape extended along the first portion 142 of the plating layer 140 and is disposed to be in contact with a part of the first portion 142 of the plating layer 140.

The frame 180 and the plating layer 140 may be welded at the first portion 142 of the plating layer 140. The welding process may be performed using various kinds of fiber lasers including a neodymium-yttrium aluminum garnet (Nd-Yag) laser, but is not limited thereto.

As indicated above, the mask 100 according to an alternate embodiment of the present disclosure includes the plating layer 140 without the frame 180.

FIG. 1I and FIG. 1J are a plan view and a cross-sectional view, respectively, illustrating the mask according to an embodiment of the present disclosure. The mask 100 according to an embodiment of the present disclosure includes the first portion 142, the second portion 144, and the third portion 146. The mask 100 shown in FIG. 1I and FIG. 1J may include substantially the same components as the plating layer 140 shown in FIG. 1G and FIG. 1H. Therefore, the components of the mask 100 shown in FIG. 1I and FIG. 1J are denoted by the same reference numerals as the respective components of the plating layer 140 shown in FIG. 1G and FIG. 1H.

The first portion 142, the second portion 144, and the third portion 146 of the mask 100 are substantially the same as the first portion 142, the second portion 144, and the third portion 146 of the plating layer 140 shown in FIG. 1F. Specifically, the first portion 142 of the mask 100 may be plating disposed at the outermost periphery to surround the plurality of cell regions CELL. The first portion 142 of the mask 100 is a plating layer surrounding the outer periphery of the plurality of cell regions CELL. The first portion 142 of the mask 100 surrounds the second portion 144 and the third portion 146 of the first conductive layer 120 as well as the cell regions CELL. The second portion 144 of the mask 100 may be the plating layer 140 located between the cell regions CELL. The second portion 144 of the mask 100 separates the plurality of cell regions CELL within the mask 100. The plurality of cell regions CELL within the mask 100 may be surrounded by the first portion 142 and the second portion 144 of the mask 100. The third portion 146 of the mask 100 may be a conductive layer having a mesh shape within the plurality of cell regions CELL. The third portion 146 of the mask 100 may include a plurality of openings 170 through which a plurality of pixels of an OLED can be formed by a sputtering process to be performed later. The third portion 146 of the mask 100 may have a mesh shape within the plurality of cell regions CELL.

Referring to the cross-sectional view in FIG. 1J, the second portion 144 and the third portion 146 of the mask 100 have an upside down "U" shape or a block "C" shape, such as this: '⊏'. It might have an opening on the bottom. Further, the first portion 142 of the mask 100 has a downward shape or a left-right reversed, upside down "L" shape as follows: '⌐'. It thus has an open bottom. This arrangement may allow to have at least one of the openings 170 having a first end opening and a second end opening that is smaller than the first end opening.

In this case, each of the first portion 142, the second portion 144 and the third portion 146 of the mask 100 has a plurality of downward flat surfaces therein. The inner surfaces of the first portion 142, the second portion 144 and the third portion 146 of the mask 100 are in contact with the first conductive layer 120 and the second conductive layer 130 during a manufacturing process. For example, referring to the cross-sectional view, each of the first portion 142, the second portion 144 and the third portion 146 of the mask 100 has a first surface and a second surface protruding downwards from at least one side of the first surface therein. The first surface is extended in a horizontal direction and the second surface is extended in a vertical direction.

The mask 100 includes an align key region 142a with a higher surface roughness than its peripheral region on a downward inner surface of a first region. Referring to FIG. 1J, the align key region 142a is formed on the first surface of the first portion 142 of the mask 100. The align key region 142a has a high surface roughness and thus has a lower reflectance than a conventional align key region. Further, a high surface roughness of the align key region 142a can suppress the generation of static electricity while the conductive layers 120 and 130 are peeled off from the plating layer 140 during the manufacturing process of the mask 100.

In FIG. 1I and FIG. 1J, the structure including the plating layer 140 welded to the frame 180 is defined as the mask 100 according to an embodiment of the present disclosure. However, only the plating 140 to which the frame 180 is not welded may be defined as a mask according to another embodiment of the present disclosure. For example, as shown in FIG. 1G and FIG. 1H, the plating layer 140 from which the first conductive layer 120 and the second conductive layer 130 have been separated before being welded to the frame 180 may be used as a mask according to another embodiment of the present disclosure.

In the method of manufacturing a mask according to an embodiment of the present disclosure, the first conductive layer 120 and the second conductive layer 130 having different properties are used as seed layers. Further, the open region 160 included in the second conductive layer 130 is used to form the region 142a with a high surface roughness in a part of the mask 100.

In the method of manufacturing a mask according to an embodiment of the present disclosure, a surface roughness of a part of the mask 100 is improved. Thus, it is possible to suppress damage to the mask 100 caused by static electricity between the substrate 110 and the mask 100 when peeling off the mask 100 from the substrate 110.

Further, in the method of manufacturing a mask according to an embodiment of the present disclosure, an align key region with a high surface roughness is formed. Thus, it is possible to reduce the reflectance of the align key region. The method of manufacturing a mask according to an embodiment of the present disclosure can suppress the deterioration of detection rate for the align key region 142a caused by high surface reflectance of the align key region 142a during the manufacturing process of the mask 100 or a sputtering process using the manufactured mask 100. Thus, it is possible to easily place the mask 100 at a desired position.

Further, in the method of manufacturing a mask according to an embodiment of the present disclosure, the second conductive layer 130 with a low surface roughness is disposed on the first conductive layer 120 having a relatively low resistance. Thus, it is possible to improve the uniformity of plating and easily separate the plating layer 140. That is, the first conductive layer 120 disposed on the substrate 110 may be formed of a metal material having a low resistance. Further, the second conductive layer 130 disposed on the first conductive layer 120 may be formed of, e.g., crystallized transparent conductive oxide with a low surface roughness. Thus, due to the first conductive layer 120 having a low resistance, the total resistance of the first conductive layer 120 and the second conductive layer 130 can be reduced. Therefore, it is possible to form the plating layer 140 with an overall uniform thickness. Further, the second conductive layer 130 disposed on the top side has a surface with a low surface roughness. Thus, when separating the plating layer 140 formed on the second conductive layer 130, it is possible to minimize tearing of the plating layer 140 or tearing of the first conductive layer 120 and the second conductive layer 130.

Figure 2:
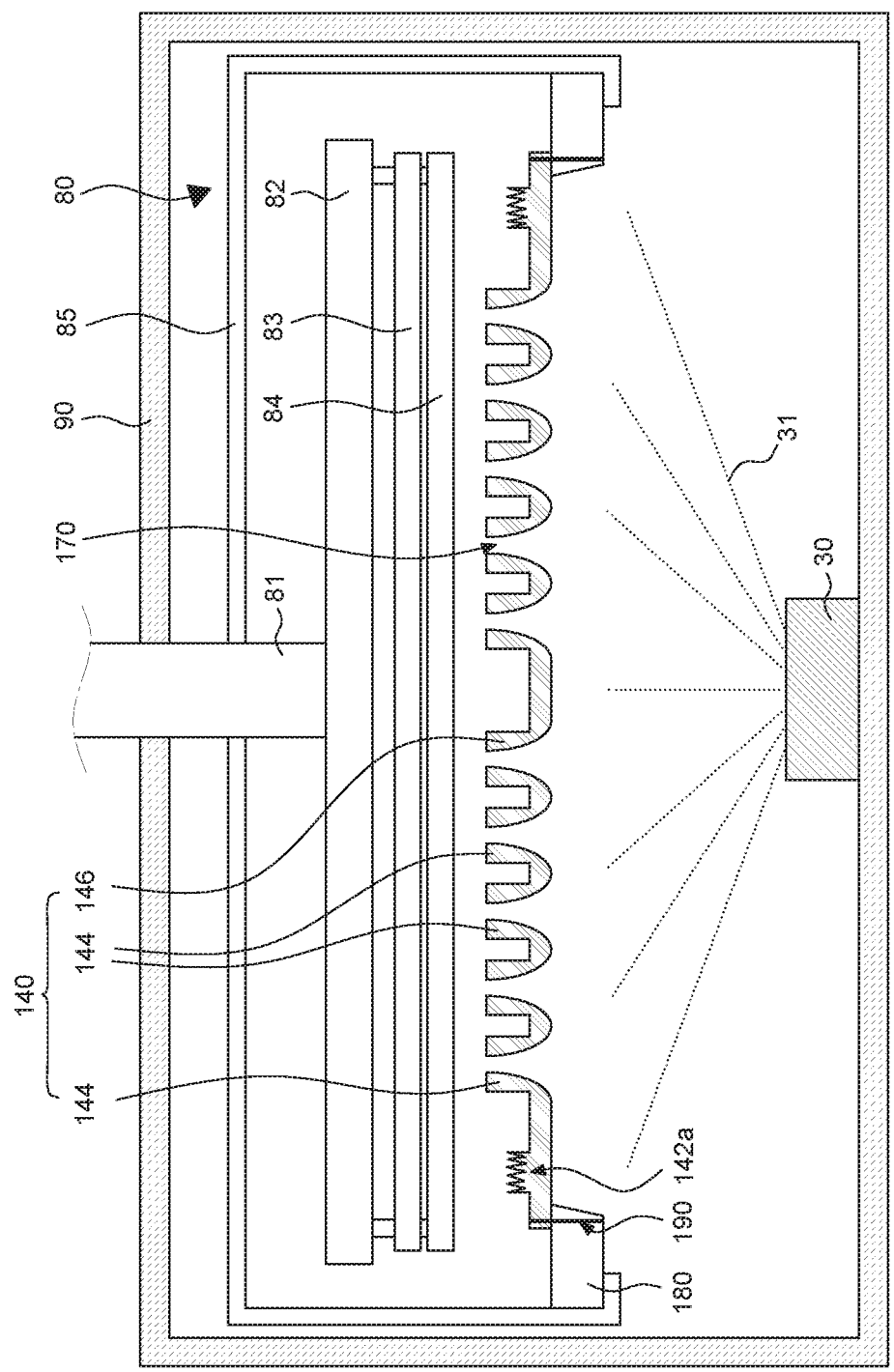
FIG. 2 is a schematic cross-sectional view illustrating a chamber where an organic material is deposited on a display panel using the mask shown in FIG. 1J.

FIG. 2 is a schematic cross-sectional view illustrating a chamber where an organic material is deposited on a display panel using the mask shown in FIG. 1H and FIG. 1I.

As shown in FIG. 2, a sputtering unit 80 and a sputtering source 30 are disposed in a vacuum chamber 90. The sputtering source 30 is under the sputtering unit 80. The sputtering unit 80 supported by a supporting shaft 81 includes a support 85, the mask 100 disposed on the support 85, and a substrate 84 which is disposed above the mask 100 and on which an organic material is to be sputtered. The sputtering unit 80 further includes a cooling plate 83 disposed above the substrate 84 to cool down the heat generated during the sputtering process, and a magnet plate 82 disposed above the cooling plate 83 to suppress sagging of the mask 100.

A source 31 derived from the sputtering source 30, which is disposed on the bottom of the vacuum chamber 90, may be heated to be vaporized or sublimated. The vaporized or sublimated source 31 from the sputtering source 30 may be selectively sputtered on the substrate 84 through the plurality of openings 170 formed in the mask 100 disposed under the substrate 84.

Figure 3:
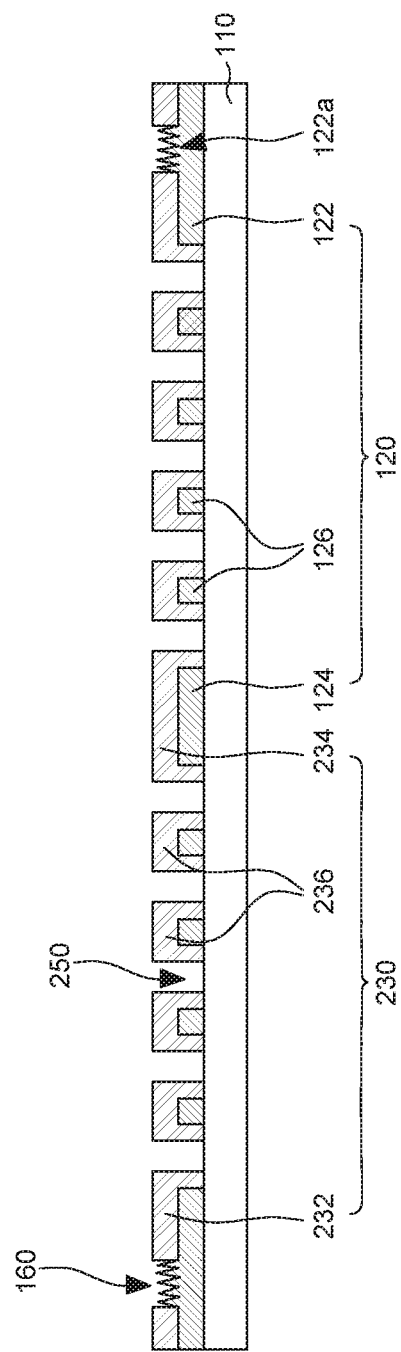
FIG. 3 is a schematic cross-sectional view provided to explain a method of manufacturing a mask according to another embodiment of the present disclosure.

FIG. 3 is a schematic cross-sectional view provided to explain a method of manufacturing a mask according to another embodiment of the present disclosure.

Referring to FIG. 3, the method of manufacturing a mask according to another embodiment of the present disclosure is the same as the method of manufacturing a mask according to an embodiment of the present disclosure described above with reference to FIG. 1A through FIG. 1J except a process of forming the second conductive layer 130. Therefore, redundant description thereof will be omitted.

Referring to FIG. 3, the method of manufacturing a mask according to another embodiment of the present disclosure includes forming the first conductive layer 120 on the substrate 110 and then forming a second conductive layer 230 including at least one open region 160 on the first conductive layer 120. In this case, the process of forming the second conductive layer 230 includes forming the second conductive layer 230 to cover upper and side surfaces of the first conductive layer 120.

Specifically, the second conductive layer 130 is formed only on the upper surface of the first conductive layer 120 as shown in FIG. 1D. However, the second conductive layer 230 is disposed to cover not only the upper surface of the first conductive layer 120 but also the side surfaces of the first conductive layer 120 in the method of manufacturing a mask according to another embodiment of the present disclosure as shown in FIG. 3.

In the method of manufacturing a mask according to another embodiment of the present disclosure, the second conductive layer 230 with a lower surface roughness is disposed to surround the first conductive layer 120 with a higher surface roughness. Thus, a plating layer 140 can be formed to be in contact with the second conductive layer 230 without contact with the first conductive layer 120. In the method of manufacturing a mask according to another embodiment of the present disclosure, the second conductive layer 230 with a lower surface roughness is disposed to surround the first conductive layer 120 with a higher surface roughness. When separating the plating layer 140 formed on the second conductive layer 230, it is possible to further suppress tearing of the plating layer 140 or tearing of the first conductive layer 120 and the second conductive layer 230.

Figure 4:
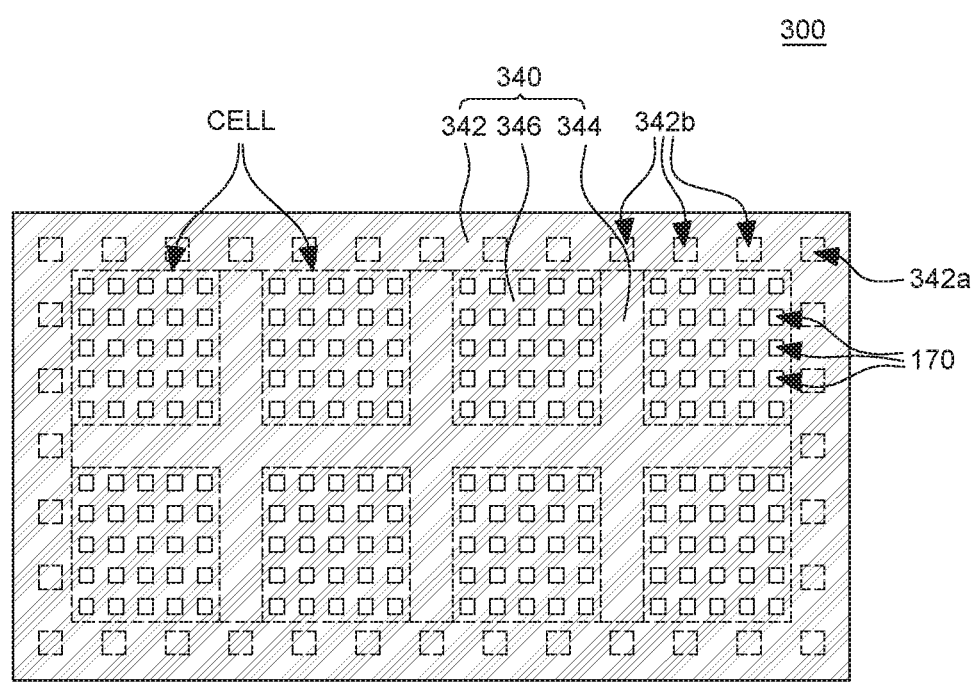
FIG. 4 is a schematic plan view of a mask according to another embodiment of the present disclosure.

FIG. 4 is a schematic plan view of a mask according to another embodiment of the present disclosure. A mask 300 shown in FIG. 4 is substantially the same as the mask 100 shown in FIG. 1I and FIG. 1J except that align key regions 342a and 342b are further disposed. Therefore, redundant description thereof will be omitted.

The mask 300 shown in FIG. 4 includes a first portion 342, a second portion 344, and a third portion 346. The first portion 342 surrounds the outer periphery of the plurality of cell regions CELL. The second portion 344 is located between the cell regions CELL. Further, the third portion 346 defines the plurality of openings 170 in the plurality of cell regions CELL.

Referring to FIG. 4, the mask 300 according to another embodiment of the present disclosure includes a plurality of align key regions 342a and 342b. The plurality of align key regions 342a and 342b includes an align key region 342a disposed at a corner of the first portion 342 and a plurality of align key regions 342b disposed along one side of the first portion 342. The plurality of first align key regions 342a and 342b is spaced at the same distance from each other and disposed along the first portion 342 to surround the plurality of cell regions CELL.

In the mask 100 shown in FIG. 1I and FIG. 1J, the align key region is disposed only at the corner of the first portion 142. However, in the mask 300 shown in FIG. 4, the plurality of first align key regions 342a and 342b is disposed along the first portion 342. The plurality of first align key regions 342a and 342b disposed along the first portion 342 makes it easy to align the mask 300. Further, since the first align key regions 342a and 342b with a higher surface roughness than their peripheral regions are increased, static electricity generated between the substrate 110 and the mask 300 when peeling off the mask 300 from the substrate 110 can be reduced. Thus, it is possible to reduce damage to the mask 300 when peeling off the mask 300.

Figure 5:
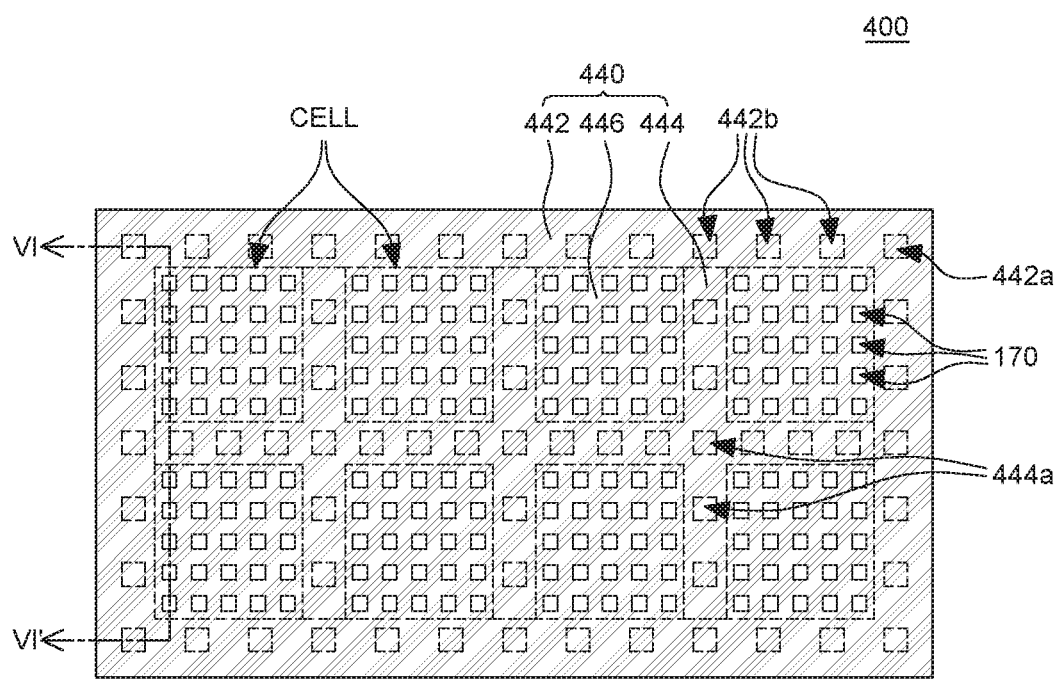
FIG. 5 is a schematic plan view of a mask according to yet another embodiment of the present disclosure.
Figure 6:
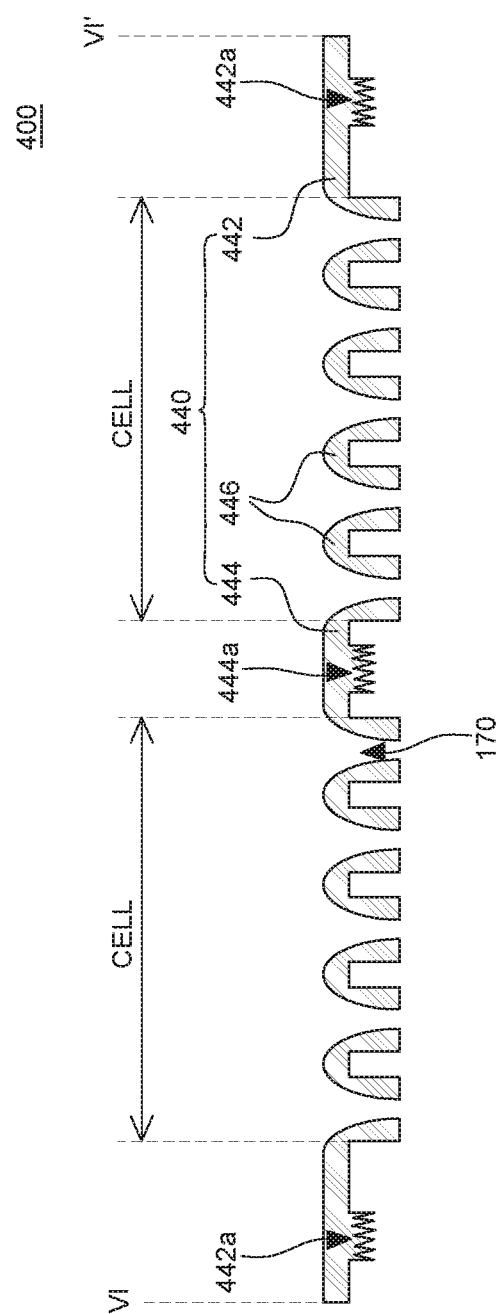
FIG. 6 is a schematic cross-sectional view of the mask as taken along a line VI-VI' of FIG. 5.

FIG. 5 is a schematic plan view of a mask according to yet another embodiment of the present disclosure. FIG. 6 is a schematic cross-sectional view of the mask as taken along a line VI-VI' of FIG. 5. A mask 400 shown in FIG. 5 and FIG. 6 is substantially the same as the mask 300 shown in FIG. 4 except that a second align key region 444a is further disposed. Therefore, redundant description thereof will be omitted.

The mask 400 shown in FIG. 5 and FIG. 6 includes a first portion 442, a second portion 444, and a third portion 446. The first portion 442 surrounds the outer periphery of the plurality of cell regions CELL. The second portion 444 is located between the cell regions CELL. Further, the third portion 446 defines the plurality of openings 170 in the plurality of cell regions CELL.

Referring to FIG. 5 and FIG. 6, the mask 400 according to yet another embodiment of the present disclosure includes a plurality of first align key regions 442a and 442b and a plurality of second align key regions 444a. The plurality of first align key regions 442a and 442b is disposed along the first portion 442 to surround the plurality of cell regions CELL. Further, the plurality of second align key regions 444a is disposed along the second portion 444. That is, the plurality of second align key regions 444a is spaced at the same distance from each other between the cell regions CELL.

The mask 400 may have a lower durability in the second portion 444 disposed inside the plurality of cell regions CELL than in the first portion 442 disposed outside the plurality of cell regions CELL. Thus, static electricity between the second portion 444 in the plurality of cell regions CELL and the substrate 110 may easily cause damage to the mask 400 disposed in the second portion 444.

The mask 300 shown in FIG. 4 includes the plurality of first align key regions 342a and 342b disposed along the first portion 342. However, the mask 400 shown in FIG. 5 and FIG. 6 further includes the plurality of second align key regions 444a disposed along the second portion 444 between the cell regions CELL. Since the plurality of second align key regions 444a is further disposed between the cell regions CELL, static electricity generated between the substrate 110 and the second portion 444 of the mask 400 when peeling off the mask 400 from the substrate 110 can be reduced. Thus, it is possible to reduce damage to the mask 400 when peeling off the mask 400.

Figure 7:
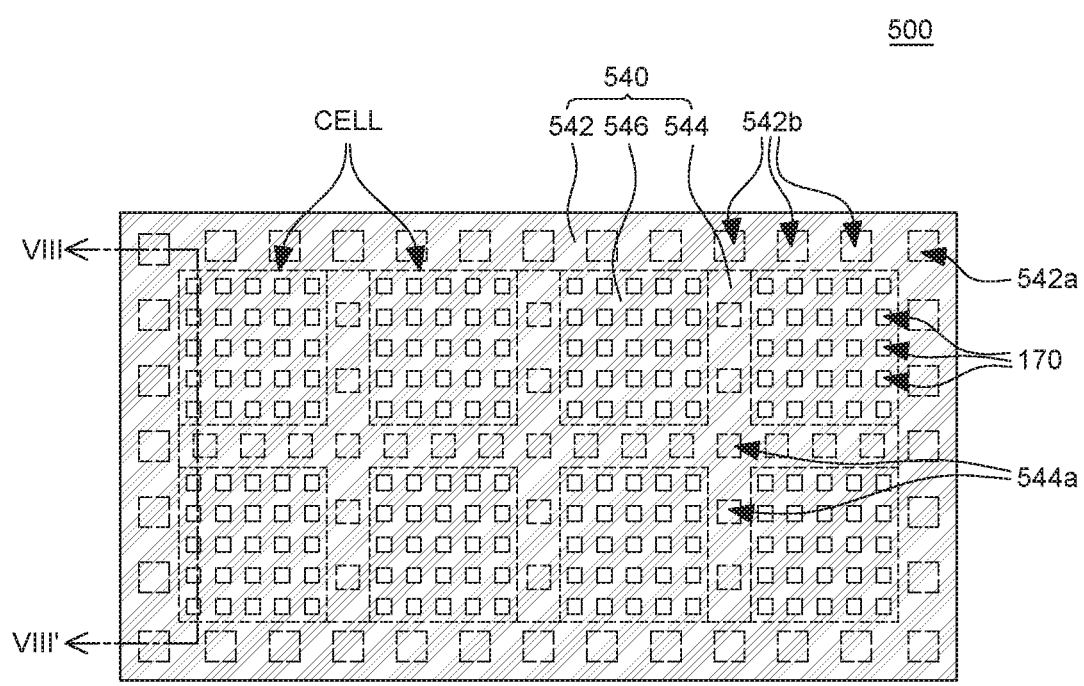
FIG. 7 is a schematic plan view of a mask according to still another embodiment of the present disclosure.
Figure 8:
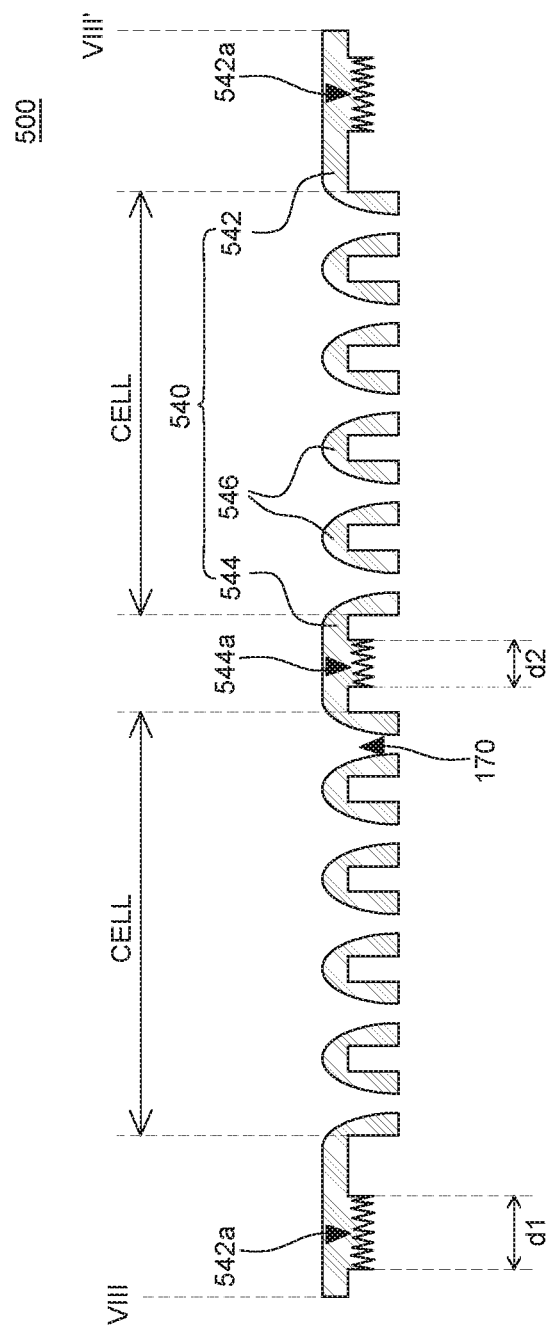
FIG. 8 is a schematic cross-sectional view of the mask as taken along a line VIII-VIII' of FIG. 7.

FIG. 7 is a schematic plan view of a mask according to still another embodiment of the present disclosure. FIG. 8 is a schematic cross-sectional view of the mask as taken along a line VIII-VIII' of FIG. 7. A mask 500 shown in FIG. 7 and FIG. 8 is substantially the same as the mask 400 shown in FIG. 5 and FIG. 6 except that first align key regions 542a and 542b are different in size from second align key regions 544a. Therefore, redundant description thereof will be omitted.

The mask 500 shown in FIG. 7 and FIG. 8 includes a first portion 542, a second portion 544, and a third portion 546. The first portion 542 surrounds the outer periphery of the plurality of cell regions CELL. The second portion 544 is located between the cell regions CELL. Further, the third portion 546 defines the plurality of openings 170 in the plurality of cell regions CELL.

Referring to FIG. 7 and FIG. 8, the mask 500 according to still another embodiment of the present disclosure includes a plurality of first align key regions 542a and 542b and a plurality of second align key regions 544a. The plurality of first align key regions 542a and 542b is disposed along the first portion 542 to surround the plurality of cell regions CELL. Further, the plurality of second align key regions 544a is disposed along the second portion 544. For example, the plurality of second align key regions 544a is spaced at the same distance from each other between the cell regions CELL. In this case, the plurality of first align key regions 542a and 542b in the first portion 542 may have a greater size than the plurality of second align key regions 544a in the second portion 544. For example, referring to FIG. 8, a length d1 of the first align key regions 542a and 542b is greater than a length d2 of the second align key regions 544a.

As described above with reference to FIG. 5 and FIG. 6, the mask 400 has a lower durability in the second portion disposed inside the cell regions CELL. Thus, the second align key regions are formed in the second portion to suppress damage to the second portion when peeling off the mask. However, to improve the process yield, as many cell regions CELL as possible need to be formed in the mask. In this case, the distance between the cell regions CELL becomes narrow and the width of the second portion is decreased.

Thus, in the mask 500 shown in FIG. 7 and FIG. 8, the first align key regions 542a and 542b disposed in the wide first portion 542 have a greater size than the second align key regions 544a disposed in the narrow second portion 544. Therefore, it is possible to maximize the number of products per unit area when manufacturing OLEDs and also possible to minimize damage when peeling off the mask. In other words, the width of the second align key regions 544a may be narrower than the first align key regions 542a and 542b.

Figure 9:
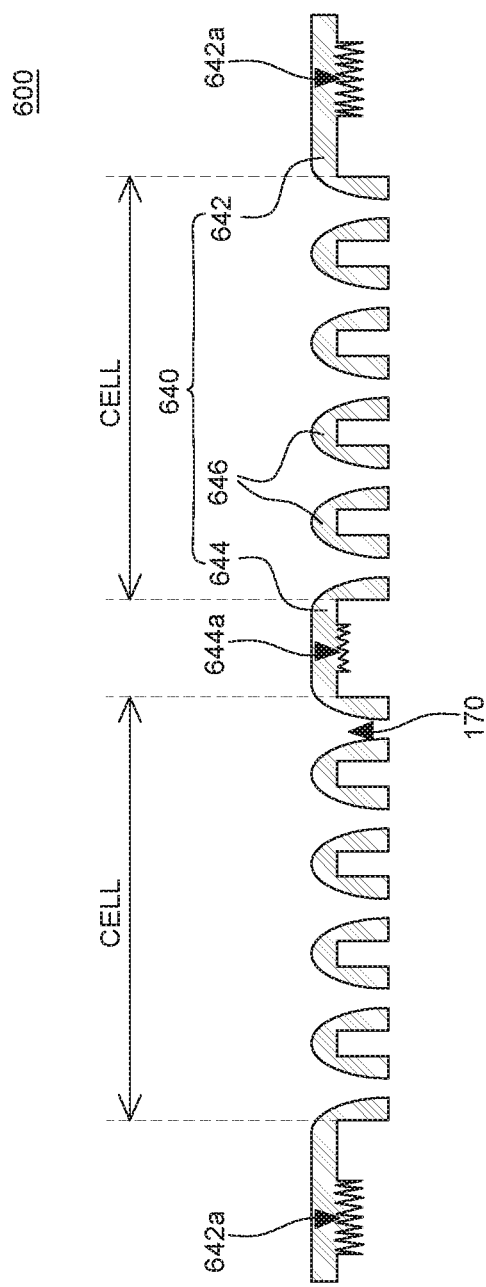
FIG. 9 is a schematic cross-sectional view of a mask according to still another embodiment of the present disclosure.

FIG. 9 is a schematic cross-sectional view of a mask according to still another embodiment of the present disclosure. A mask 600 shown in FIG. 9 is substantially the same as the mask 400 shown in FIG. 5 and FIG. 6 except that first align key regions 642a and 642b are different in surface roughness from second align key regions 644a. Therefore, redundant description thereof will be omitted.

The mask 600 shown in FIG. 9 includes a first portion 642, a second portion 644, and a third portion 646. The first portion 642 surrounds the outer periphery of the plurality of cell regions CELL. The second portion 644 is located between the cell regions CELL. Further, the third portion 646 defines a plurality of openings in the plurality of cell regions CELL.

Referring to FIG. 9, the mask 600 according to still another embodiment of the present disclosure includes a plurality of first align key regions 642a and 642b and a plurality of second align key regions 644a. The plurality of first align key regions 642a and 642b is disposed along the first portion 642 to surround the plurality of cell regions CELL. Further, the plurality of second align key regions 644a is disposed along the second portion 644. In this case, the plurality of first align key regions 642a and 642b in the first portion 642 may have a higher surface roughness than the plurality of second align key regions 644a in the second portion 644.

In the mask 600 shown in FIG. 9, a plurality of align key regions with different surface roughness for respective regions is formed. Therefore, it is possible to regulate static electricity generated between a substrate and each region of the mask according to the shape of the mask.

Hereafter, the above-described effects of the present disclosure will be described in more detail with reference to Examples and Comparative Examples. However, the following Examples are provided for illustrative purposes only but not intended to limit the scope of the present disclosure.

Experimental Example

A first conductive layer was sputtered on a substrate, and a second conductive layer was sputtered on the first conductive layer and electroplating was performed to form a mask. Then, a plating layer was separated from the substrate, the first conductive layer, and the second conductive layer to manufacture a mask.

In Example 1, molybdenum (Mo) was used for the first conductive layer and polycrystalline-indium tin oxide (poly-ITO) was used for the second conductive layer. In Example 2, a double layer of molybdenum-titanium alloy (MoTi) and copper (Cu) was used for the first conductive layer and poly-ITO was used for the second conductive layer.

In Comparative Example 1, poly-ITO was used for a single conductive layer and in Comparative Example 2, molybdenum (Mo) was used for a single conductive layer, and then electroplating was performed thereto. In Comparative Example 3, a double conductive layer formed of molybdenum-titanium alloy (MoTi) and copper (Cu) was used and in Comparative Example 4, a triple conductive layer formed of molybdenum (Mo), copper (Cu), and molybdenum (Mo) was used. In Comparative Example 5, a triple conductive layer formed of molybdenum-titanium alloy (MoTi), aluminum (Al), and molybdenum-titanium alloy (MoTi) was used. In Comparative Example 6, a triple conductive layer formed of molybdenum-titanium alloy (MoTi), copper (Cu), and a-ITO was used. Then, electroplating was performed thereto.

With the masks manufactured according to Examples and Comparative Examples, a reliability test was performed on the plating layer formed by electroplating. In the reliability test on the plating layer and whether peeling occurs during plating and whether it is easy to separate after forming the mask were evaluated. Further, whether the plating layer is torn off when separating the formed mask and the uniformity in thickness of the formed plating layer were evaluated. The test results were as shown in the following Table 1.

TABLE 1

| | Composition of conductive layer | Average conductive layer resistance (Ω) | Peeling of plating layer during plating | Easiness to separate plating layer | Tearing of conductive layer | Thickness deviation of plating layer |
|---|---|---|---|---|---|---|
| Example 1 | poly-ITO/Mo | 0.43 | None | OK | Not occurred | Medium |
| Example 2 | poly-ITO/Cu/MoTi | 0.11 | None | OK | Not occurred | Small |
| Comparative Example 1 | poly-ITO | 55.81 | Small | OK | Not occurred | Large |
| Comparative Example 2 | Mo | 0.51 | Medium | NG | Occurred | Medium |
| Comparative Example 3 | Cu/Moti | 0.09 | None | NG | Occurred | Small |
| Comparative Example 4 | Mo/Al/Mo | 0.10 | None | Δ | Not occurred | Small |
| Comparative Example 5 | MoTi/Cu/Moti | 0.11 | Medium | NG | Occurred | Small |
| Comparative Example 6 | a-ITO/Cu/MoTi | 0.13 | Small | OK | Occurred | Small |

In Table 1, the average conductive layer resistance refers to the average sheet resistance of the plating layer and the peeling of plating layer during plating means that whether peeling of the plating layer is observed during the plating process. Further, the easiness to separate plating layer means that the conductive layer is not peeled off when separating the plating layer. Furthermore, the tearing of conductive layer means that whether a part of the plating layer is torn off as adhering to the conductive layer when separating the plating layer. The thickness deviation of plating layer refers to the degree of deviation in thickness of the plating layer after the plating process is completed. Referring to Table 1, it can be seen that if the conductive layer is formed of only poly-ITO having high resistance as shown in Comparative Example 1, the thickness deviation of the formed plating layer is very large. Further, it can be seen that if each of the single layer and the multilayer is formed of only metal materials having low resistance as shown in Comparative Examples 2 through 5, the thickness deviation of the formed plating layer is excellent. However, in these cases, it is difficult to peel off the formed plating layer.

The plating layer used in Comparative Example 6 had a structure in which a-ITO was sputtered on a MoTi/Cu double layer having low resistance. It can be seen that in Comparative Example 6 using a-ITO for the conductive layer, the conductive layer is easily torn off, compared to Example 2 using poly-ITO. This is because a-ITO has a higher surface roughness and is not smoother than poly-ITO, and, thus, the conductive layer is easily torn off when peeling off the plating layer. This may result in quality degradation of the plating layer.

However, it can be seen that if a metal material having low resistance is used for the first conductive layer and poly-ITO having high resistance is used for the second conductive layer and then plating is performed, it is easy to peel off the plating layer. Also, it can be seen that the plating layer has a uniform thickness.

The exemplary embodiments of the present disclosure can also be described as follows:

According to an aspect of the present disclosure, there is provided a method of manufacturing a mask. The method of manufacturing a mask comprises forming a first conductive layer including a third portion having a mesh shape in a plurality of cell regions on a substrate, a second portion disposed between the cell regions on the substrate, and a first portion surrounding the third portion and the second portion on the substrate, forming a second conductive layer on the first conductive layer, the second conductive layer having at least one opening therethrough that exposes at least one part of the first conductive layer, oxidizing the exposed part of the first conductive layer through the at least one opening of the second conductive layer, forming a plating layer on the first conductive layer and the second conductive layer, and removing the first conductive layer and the second conductive layer from the plating layer resulting in the mask that is comprised of the plating layer.

The forming the second conductive layer may include forming the second conductive layer to cover upper and side surfaces of the first conductive layer.

The forming the second conductive layer may include forming a plurality of first openings that exposes the part of the first conductive layer in the first portion.

The forming the second conductive layer may include forming a plurality of first openings that exposes the part of the first conductive layer in the first portion and a plurality of second opening that exposes the part of the first conductive layer in the second portion.

The first openings may have a greater size than the second open regions.

The first conductive layer exposed through the first openings may have a higher surface roughness than the first conductive layer exposed through the second openings.

The oxidizing the exposed part of the first conductive layer may include performing a high-temperature heat treatment to the first conductive layer and the second conductive layer.

The performing the high-temperature heat treatment may include controlling a surface roughness of the exposed part of the first conductive layer by regulating at least one variable related to time used in the heat treatment or temperature used in the heat treatment.

The oxidizing the exposed part of the first conductive layer may include crystallizing the second conductive layer.

The first conductive layer may be made of a conductive material having a lower resistance than the second conductive layer.

The first conductive layer may be made of a metal material, and the second conductive layer may be made of transparent conductive oxide.

According to another aspect of the present disclosure, there is provided a mask. The mask comprises a first portion surrounding an outer periphery of a plurality of cell regions, a second portion located between the cell regions, and a third portion defining a plurality of openings in the plurality of cell regions. An align key region may be located within the first portion. The align key region has a higher surface roughness than a peripheral region adjacent to the align key region within the first portion.

A cross section of the second portion and the third portion may have an upside down "U" shape or a block "C" shape, such as this: '⊏'. It might have an opening on the bottom.

Each of the first portion, the second portion, and the third portion may have a first surface and a second surface extending down from at least one side of the first surface in a cross-sectional view thereof, and the align key region may be disposed on the first surface.

The align key region may be include a plurality of first align key regions disposed along the first portion and a plurality of second align key regions disposed along the second portion.

The first align key regions may have a greater size than the second align key regions.

The first align key regions may have a higher surface roughness than the second align key regions.

The mask may be formed by a plating process.

According to another aspect of the present disclosure, a mask includes a plurality of first regions. A plurality of holes are located on each of the plurality of first regions, at least one of the holes having a first end opening and a second end opening that is smaller than the first end opening. The mask also includes a second region located between the first regions. The mask further includes a third region surrounding the first regions and the second region. A reflectance value on a first surface located on the second region or the third region is lower than a reflectance value on a second surface located on the second region or the third region.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a mask, comprising:
   forming a first conductive layer on a substrate;
   forming a second conductive layer on the first conductive layer, the second conductive layer having at least one opening therethrough that exposes at least one part of the first conductive layer;
   oxidizing the exposed part of the first conductive layer through the at least one opening of the second conductive layer;
   forming a plating layer on the first conductive layer and the second conductive layer; and
   removing the first conductive layer and the second conductive layer from the plating layer resulting in the mask that is comprised of the plating layer.

2. The method of manufacturing a mask according to claim 1, wherein the first conductive layer comprises:
   a third portion having a mesh shape in a plurality of cell regions on the substrate;
   a second portion disposed between the cell regions on the substrate; and
   a first portion surrounding the third portion and the second portion on the substrate.

3. The method of manufacturing a mask according to claim 1, wherein the forming the second conductive layer includes forming the second conductive layer to cover upper and side surfaces of the first conductive layer.

4. The method of manufacturing a mask according to claim 2, wherein the forming the second conductive layer includes forming a plurality of first openings that exposes the part of the first conductive layer in the first portion.

5. The method of manufacturing a mask according to claim 2, wherein the forming the second conductive layer includes forming a plurality of first openings that exposes the part of the first conductive layer in the first portion and a plurality of second openings that exposes the part of the first conductive layer in the second portion.

6. The method of manufacturing a mask according to claim 5, wherein the first openings have a greater size than the second openings.

7. The method of manufacturing a mask according to claim 5, wherein the first conductive layer exposed through the first openings has a higher surface roughness than the first conductive layer exposed through the second openings.

8. The method of manufacturing a mask according to claim 1, wherein the oxidizing the exposed part of the first conductive layer includes performing a high-temperature heat treatment to the first conductive layer and the second conductive layer.

9. The method of manufacturing a mask according to claim 8, wherein the performing the high-temperature heat treatment includes controlling a surface roughness of the exposed part of the first conductive layer by regulating at least one variable related to time used in the heat treatment or temperature used in the heat treatment.

10. The method of manufacturing a mask according to claim 8, wherein the oxidizing the exposed part of the first conductive layer includes crystallizing the second conductive layer.

11. The method of manufacturing a mask according to claim 1, wherein the first conductive layer is made of a conductive material having a lower resistance than the second conductive layer.

12. The method of manufacturing a mask according to claim 11, wherein the first conductive layer is made of a metal material, and
   the second conductive layer is made of transparent conductive oxide.

* * * * *